US009160346B2

(12) United States Patent
Khawshe et al.

(10) Patent No.: US 9,160,346 B2
(45) Date of Patent: Oct. 13, 2015

(54) AREA AND POWER EFFICIENT CLOCK GENERATION

(75) Inventors: Vijay Khawshe, Sunnyvale, CA (US); Farshid Aryanfar, Sunnyvale, CA (US)

(73) Assignee: Rambus Inc., Sunnyvale, CA (US)

(*) Notice: Subject to any disclaimer, the term of this patent is extended or adjusted under 35 U.S.C. 154(b) by 229 days.

(21) Appl. No.: 14/002,267

(22) PCT Filed: Feb. 7, 2012

(86) PCT No.: PCT/US2012/024197
§ 371 (c)(1),
(2), (4) Date: Aug. 29, 2013

(87) PCT Pub. No.: WO2012/125237
PCT Pub. Date: Sep. 20, 2012

(65) Prior Publication Data
US 2013/0336082 A1    Dec. 19, 2013

Related U.S. Application Data

(60) Provisional application No. 61/452,756, filed on Mar. 15, 2011.

(51) Int. Cl.
| | |
|---|---|
| *G11C 8/18* | (2006.01) |
| *H03L 7/08* | (2006.01) |
| *G11C 5/00* | (2006.01) |
| *G11C 5/06* | (2006.01) |
| *G06F 1/04* | (2006.01) |
| *G06F 1/10* | (2006.01) |
| *H03L 7/099* | (2006.01) |
| *G11C 7/22* | (2006.01) |

(52) U.S. Cl.
CPC .. *H03L 7/08* (2013.01); *G06F 1/04* (2013.01); *G06F 1/10* (2013.01); *G11C 5/005* (2013.01); *G11C 5/06* (2013.01); *G11C 8/18* (2013.01); *H03L 7/099* (2013.01); *G11C 7/222* (2013.01)

(58) Field of Classification Search
CPC ............ H03L 7/08; H03L 7/099; G11C 8/18; G11C 5/06; G11C 5/005; G06F 1/10; G06F 1/04
USPC ....................... 365/233.12, 149; 331/36 C, 18
See application file for complete search history.

(56) References Cited

U.S. PATENT DOCUMENTS

| | | |
|---|---|---|
| 5,475,345 A | 12/1995 | Gabara |
| 5,747,982 A | 5/1998 | Dromgoole et al. |

(Continued)

OTHER PUBLICATIONS

Asimakopoulos et al., "Evaluation of energy-recovering interconnects for low-power 3D stacked ICs," IEEE International Conference on 3D System Integration, 2009, pp. 1-5, Sep. 28-30, 2009. 5 pages.
Kannan et al., Abstract for "New Testing Technique for Copper TSV in 60GHz Wireless Applications," Poster Paper at the International Workshop on Testing Three-Dimensional Stacked Integrated Circuits, Nov. 2010. 1 page.

(Continued)

*Primary Examiner* — Toan Le
(74) *Attorney, Agent, or Firm* — Charles Shemwell (57) ABSTRACT

Die-to-die interconnect structures are leveraged to form the inductive component of an LC oscillator, thus yielding an LC tank distributed across multiple IC dies rather than lumped in a single die. By this arrangement, reliance on area/power-consuming on-chip inductors may be reduced or eliminated, and phase-aligned clocks may be extracted from the LC tank within each of the spanned IC dies, obviating multiple oscillator instances or complex phase alignment circuitry.

20 Claims, 4 Drawing Sheets

(56) References Cited

U.S. PATENT DOCUMENTS

| | | |
|---|---|---|
| 7,508,280 B2 | 3/2009 | Gabara |
| 7,511,588 B2 | 3/2009 | Gabara |
| 2006/0132249 A1* | 6/2006 | Gabara et al. ............. 331/117 R |
| 2007/0018739 A1* | 1/2007 | Gabara ....................... 331/167 |
| 2011/0050336 A1 | 3/2011 | Lu et al. |

OTHER PUBLICATIONS

Lee et al., "Modeling and analysis of die-to-die vertical coupling in 3-D IC," 11th Electronics Packaging Technology Conference, 2009. pp. 707-711, Dec. 9-11, 2009. 5 pages.

Notification Concerning Transmittal of International Preliminary Report on Patentability dated Sep. 26, 2013 in International Application No. PCT/US2012/024197. 6 pages.

* cited by examiner

AREA AND POWER EFFICIENT CLOCK GENERATION

CROSS REFERENCE TO RELATED APPLICATIONS

Pursuant to 35 U.S.C. §§365 and 371, this application is a United States National Stage Application that claims priority to International Application No. PCT/US2012/024197 filed Feb. 7, 2012, which claims priority to U.S. Provisional Patent Application No. 61/452,756 filed Mar. 15, 2011. Each of the above-identified patent applications is hereby incorporated by reference in its entirety.

TECHNICAL FIELD

The present invention relates generally to the field of integrated circuits, and more particularly to clock generation in integrated circuits and systems of integrated circuit devices.

BACKGROUND

As integrated-circuit (IC) clock frequencies rise, clock circuit designers are increasingly opting for LC (inductor-capacitor) oscillators instead of conventional ring oscillators. LC oscillators generally exhibit superior noise and jitter performance, but at the cost of increased die-area primarily due to on-chip inductors. Moreover, where clock distribution is required across multiple dies, use of local clock generator circuits increases power consumption.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In various embodiments disclosed herein, die-to-die interconnect structures are leveraged to form the inductive component of an LC oscillator, thus yielding an LC tank circuit distributed across multiple integrated circuit (IC) dies rather than lumped in a single die. This arrangement not only reduces reliance on area/power-consuming on-chip inductors, but also enables phase-aligned clocks to be extracted from the LC tank within each of the spanned IC dies, thereby saving die area and power otherwise consumed by multiple oscillator instances or complex phase alignment circuitry.

In one embodiment, the die-to-die interconnect structures include through-silicon-vias and micro bumps used to interconnect a stack of IC dies. In other embodiments, the interconnect structures may additionally or alternatively include conductive elements used to interconnect two or more integrated circuit chips stacked and/or disposed side-by-side in a system-in-package (SIP) configuration, system on chip (SOC) or multi-chip module (MCM), and/or conductive elements used to interconnect two or more integrated circuit packages (e.g., in a package-on-package (POP) or package-in-package (PIP) arrangement).

Figure 1:
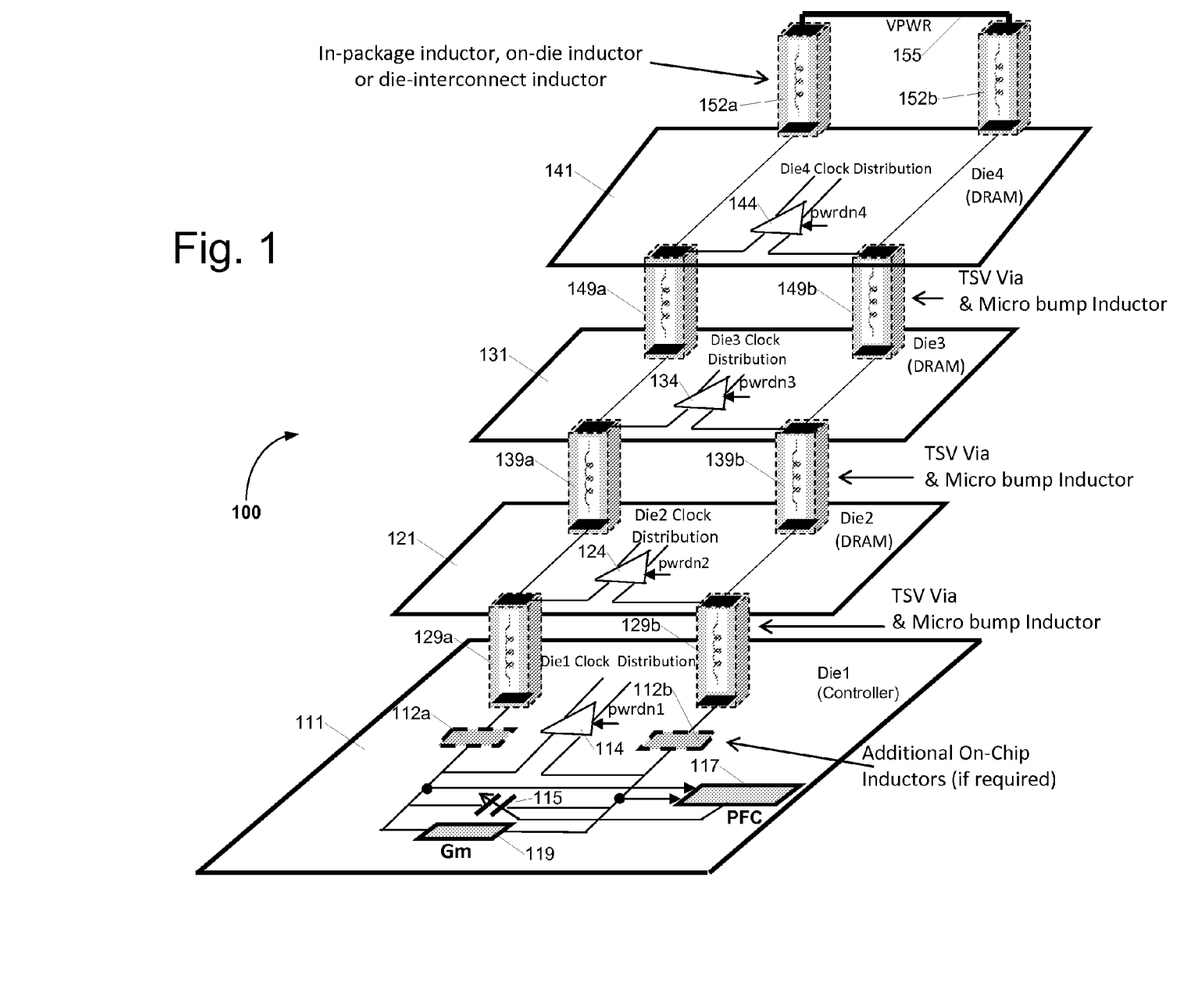
FIG. 1 illustrates an embodiment of a multi-die component 100 formed by a stack of four IC dies and clocked by an interconnect-distributed LC oscillator.

FIG. 1 illustrates an embodiment of a multi-die component 100 formed by a stack of four IC dies and clocked by an interconnect-distributed LC oscillator. In the particular embodiment shown, and in other examples herein, the multi-die component is assumed to constitute a dynamic random access memory (DRAM) system and thus includes a DRAM controller die 111 (the "controller die"), and three DRAM dies, 121, 131 and 141. The controller die controls the operation of the memory dies (e.g., outputting commands, addresses and write data, and receiving read data via various signaling links not shown in FIG. 1) and may be, for example and without limitation, a single-core or multi-core processor, graphics processing unit (GPU), mobile applications processor, application-specific integrated circuit (ASIC), etc.

While the exemplary memory system of FIG. 1 is carried forward in the description of more detailed figures and alternative embodiments that follow, the clocking architecture disclosed may be deployed in virtually any system of interconnected IC dies, including systems of other types of memory dies, such as static random access memory (SRAM), flash memory and so forth. Further, the dies may be stacked in a staircase or offset arrangement, or otherwise oriented in such a way that a surface region adjacent an edge of a given die is exposed, thereby enabling connection via wire-bond, flex-tape or other die-interconnect structure. More generally, while the interconnect-distributed LC oscillator is described primarily in the context of a three-dimensional die-stack and die-to-die interconnects thereof, the distributed LC oscillator may be implemented in virtually any organization of IC dies (e.g., disposed in a system-in-package, system-on-chip, package-on-package, package-in-package, multi-chip module, etc.) using a broad variety of conductive interconnects (e.g., wire bonding, flex-tape, etc.).

Still referring to FIG. 1, the controller die 111 includes a gain circuit 119 ("Gm") that energizes the distributed LC tank at its resonant frequency, as well as a phase-frequency controller 117 ("PFC") that tunes the resonant frequency of the tank according to a reference clock (e.g., from a crystal oscillator or other off-die or on-die reference). The LC tank circuit itself is formed by a variable-capacitance element 115 coupled in parallel with a distributed inductance, the latter including parallel stacks (or branches or columns) of inductive structures that interconnect adjacent dies within multi-die component 100 (i.e., die-to-die interconnect structures 129*a*, 139*a*, 149*a* in one stack and 129*b*, 139*b* and 149*b* in another stack), as well as a pair of inductive elements 152*a* and 152*b* coupled between power rail 155 (e.g., a supply-voltage conductor (VPWR) within the package) and the respective stacks of inductive die-interconnect structures. The power-coupled inductive elements 152*a* and 152*b*, referred to herein as "terminal inductors" as they represent terminal inductive elements of the respective inductor stacks, may be disposed within an IC package at the top of the die stack or, alternatively, at the bottom of the die stack (e.g., if the entire die stack is flipped) to interconnect the inductor stacks to a power conductor disposed on the surface of a package substrate, or even formed in part or whole within the nearest one of the IC dies, or by other die-interconnect structures as explained below. Also, if necessary to achieve a nominal inductance, additional on-chip inductors 112a and 112b may be provided within the controller die 111 and/or any of the memory dies, with each or any of the on-die inductors being switchably or permanently coupled in line with a respective inductive interconnect stack. Transistor switching elements may be operated under control of a programmable register to enable on-chip inductive components (e.g., 112a, 112b) to be bypassed or coupled in series with the stacks of die-interconnect structures.

In the embodiment of FIG. 1, the constituent IC dies of multi-die component 100 are coupled to one another by arrays of through-silicon vias (TSVs). That is, each IC die (possibly excepting controller die 111) includes an array of conductive vias that extend through the die substrate to meet a connection point above and below, thus forming an array of columnar interconnects, each columnar interconnect being coupled in common to all the dies in the die stack. In one embodiment, each TSV within a given die is coupled to the die below (or above in a flip-chip orientation) by a micro-bump, with each TSV/micro bump unit forming an inductive element (129a, 129b, 139a, 139b, 149a, 149b) within the distributed LC tank. Depending on the net inductance required for the target oscillation frequency, and the inherent inductance of each TSV/micro bump unit, two or more of the TSV/micro bump structures may be switchably or permanently coupled in parallel (i.e., ganged) or in series to establish the inductance of each inductive element. For example, the tank circuit may include multiple parallel-coupled TSV and/or micro-bump structures per die (or for any subset of the dies) to lower the net inductance that would otherwise result from a single TSV/micro-bump structure per die, or may include multiple series-coupled TSV/micro-bump structures per die (or for any subset of the dies) to increase the net inductance relative to that of a single TSV/micro-bump structure per die. In one embodiment, a control register is provided within each IC die to couple a programmed number of interconnect structures (e.g., TSV/micro-bump) in parallel and/or series to establish an inductance according to a target clock frequency, number of dies in the die stack, fabrication process, etc.

Still referring to FIG. 1, the voltage differential between the two die-interconnect stacks (also referred to herein as "inductor stacks") is tapped within each die to yield the die clock source. More specifically, within each die, a clock tree or other clock distribution circuit 114, 124, 134, 144 receives a differential input clock from respective connections to the inductor stacks, and fans out the input clock to the various clocked I/O (input/output) and logic circuits. Though not specifically shown, the clock distribution circuit may include frequency dividers to produce various different clock domains within each IC die (e.g., a logic clock domain that may operate at a lower frequency than an I/O clock domain) as well as various phase adjustment circuits to compensate for or otherwise control skew or other sources of timing offset between two dies or between circuit blocks on a given die. As shown, each of the clock distribution circuits 114, 124, 134, 144 may be switched between an active operating state and a low power operating state (e.g., disabled or switched off in the latter instance) in response to respective power-down signals (pwrdn1-pwrdn4), thereby enabling low power operation (e.g., sleep and/or power-down modes) during idle periods.

Figure 2:
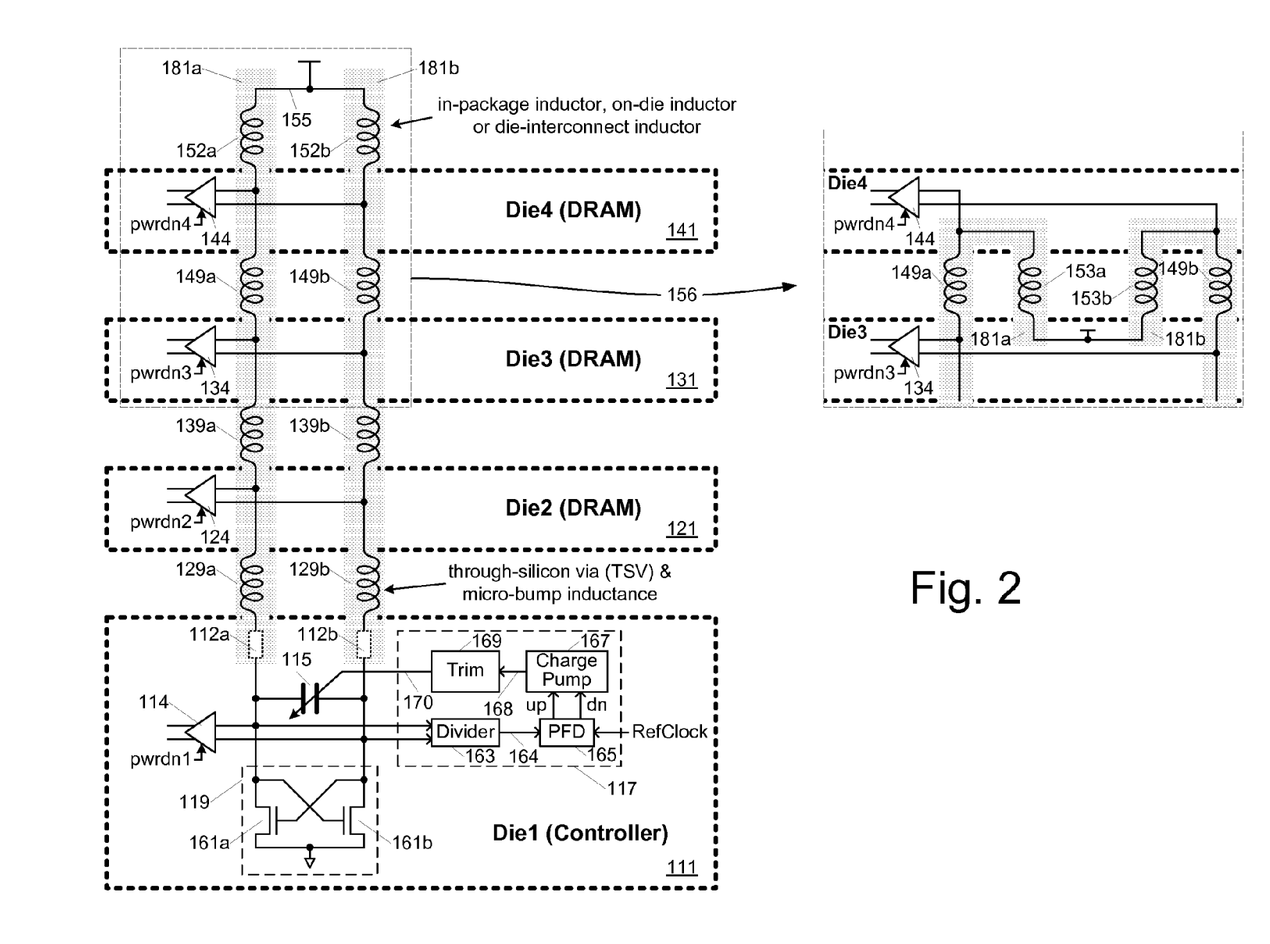
FIG. 2 illustrates the multi-die component of FIG. 1 schematically, showing exemplary detail with respect to the gain circuit and phase-frequency controller.

FIG. 2 illustrates the multi-die component of FIG. 1 schematically, showing exemplary detail with respect to the gain circuit 119 and phase-frequency controller 117. In the embodiment shown, gain circuit 119 includes a pair of transistors 161a and 161b (e.g., MOS transistors), each coupled in series between a respective inductor stack (181a or 181b) and ground, and having a control input cross-coupled to the counterpart inductor stack. By this arrangement, as the voltage across capacitive element 115 oscillates (i.e., at the resonant frequency of the tank), transistors 161a and 161b are alternately switched between conducting and non-conducting states to reinforce the direction of current flow through the tank, thus delivering energy to the tank (countering resistive energy loss) that establishes a controlled signal swing at the tank's resonant frequency. Moreover, because the inductive elements coupled in series within a given inductor stack (181a or 181b) form one resonator made of low-loss sections (i.e., assuming a reasonably high quality factor (Q), which is readily achievable in view of the low-loss die interconnect structures 129a/b, 139a/b, 149a/b), the relative phases of the respective voltage drops across those inductive elements are identical (or substantially identical) at any point in time. Consequently, the same-polarity voltage develops at the clock output (i.e., the voltage between the inductor stacks 181a, 181b at the clock taps) of each die simultaneously, thereby yielding phase-aligned clocks throughout the multi-die component. That is, the clock signals for the respective dies are extracted from the same LC tank and thus are all in phase so long as the Q of each inductive component is reasonably high.

In the embodiment of FIG. 2, capacitive element 115 has a voltage-controlled capacitance (e.g., as in a varactor diode) to enable the distributed LC tank circuit to be operated as a voltage controlled oscillator (i.e., resonant frequency of the tank circuit, $1/(2\pi(LC)^{1/2})$, adjusted by changing the capacitance of element 115 and thus by changing the control voltage or signal supplied thereto). The phase-frequency controller 117 provides closed-loop control of the capacitance value to lock the frequency and phase of the tank oscillation (and thus output clock frequency and phase) to a multiple of a reference clock signal ("RefClock"). More specifically, the differential clock extracted from controller-die clock nodes of the voltage controlled oscillator (VCO) is supplied to divider 163 which yields a frequency-divided clock 164. A phase/frequency-detector 165 (e.g., a bang-bang or "type 1" phase detector in this example, though a difference-frequency ("type 2") phase detector or other type of analog or digital phase detector, may alternatively be used) determines whether the phase frequency-divided clock leads or lags the reference clock phase, and asserts an up or down signal to charge pump 167 accordingly. Charge pump 167 cumulatively raises and lowers a control voltage 168 in response to the up and down signal assertions, and a trim circuit 169 converts the control voltage to a digital control signal 170 that is applied to adjust the capacitance of the capacitive element 115. Through this negative feedback arrangement, the capacitance of capacitive element 115 is adjusted as necessary to yield a clock output that, when frequency-divided within divider 163 is phase and frequency locked to the reference clock. By this arrangement, the distributed LC tank circuit (i.e., power-coupled stacks 181a, 181b, and capacitive element 115), gain circuit 119 and phase/frequency controller 117 form a phase-locked loop that produces clocks within each of the IC dies 111, 121, 131, 141 that are phase-aligned with one another and with the reference clock, and that are frequency multiples of the reference clock in accordance with the frequency divisor applied within divider circuit 163. If supported by the tunable range of the voltage controlled oscillator (which may be extended by switchably including or bypassing inductive elements within the tank), the frequency divisor applied by divider 163 may be programmably controlled (e.g., via a configuration register setting) to enable programmable clock frequency selection.

Still referring to FIG. 2, it should be noted that trim circuit 169 may be omitted and the analog charge pump output 168 applied directly to variable capacitive element 115 (e.g., where the variable capacitor is implemented by an analog-control varactor diode or the like). Similarly, divider 163 may be omitted if no frequency multiplication is required within the phase locked loop (i.e., divider ratio set to unity). Also, instead of centralizing gain circuit 119 within controller die 111 as shown, the gain circuit may be distributed within all or any subset of the IC dies. Moreover, on-chip inductive elements 112a, 112b may optionally be provided as shown within the controller die 111 or any other IC die to provide the necessary tank inductance, with such inductances being switchably bypassed or coupled in series within the inductor stacks to enable coarse- or fine-tuning of the LC tank circuit. Further, while the primary inductive components of the tank are depicted as the TSV and micro-bump inductances discussed above, any other die-interconnect and/or package-interconnect structures (conductors) may alternatively or additionally form part of the tank inductance.

In a test simulation of a circuit arrangement corresponding to FIG. 2, two stacks of four TSVs (each TSV having a diameter of approximately 100 um and height of 100 um) and corresponding micro bumps were applied to generate a distributed in-phase set of clocks having a target frequency of 5 GHz (gigahertz). Each TSV/micro bump unit was estimated to contribute an inductance of 150 pH (picohenries), and a variable capacitor having a nominal capacitance of 0.5 pf (picofarad) was applied, so that top-pin package inductors (i.e., corresponding to elements 152a, 152b in FIGS. 1 and 2) each having an inductance of 400 pH were provided to meet the requisite tank inductance of approximately 2 nH (i.e., 8*150 pH+2*400 pH, where '*' denotes multiplication). No on-chip inductors were required, thus yielding a die area savings corresponding to 100% of an on-chip 2 nH inductor. Moreover, the quality factor (Q) was determined to be approximately five times better than that of an on-die inductor at least in part due to the thicker conductive elements and lower loss. In terms of phase-matching and power performance, the simulation showed a phase mismatch of less than 2% between adjacent die, and no additional PLL or clock synchronizing circuitry was required outside of the first die in the stack, substantially lowering the overall power consumption.

As explained above, terminal inductors 152a and 152b may be implemented by in-package inductors, one-die inductors or even other die-interconnect inductances. In an embodiment shown in detail view 156, for example, die-interconnect structures 153a and 153b (e.g., TSV and micro-bump) form the terminal inductors (otherwise shown at 152a, 152b), coupling respective clock output nodes within Die4 (141) to a power supply node (e.g., $V_{DD}$) within Die3 (131), thus terminating each inductor stack 181a, 181b (or inductive path) within Die3. As with other inductive elements of the distributed LC tank circuit, each structure 153a, 153b may be formed by multiple die-interconnects coupled in parallel and/or series to establish a desired elemental inductance, with the parallel and/or series connections being switchably controlled by signals from one or more configuration registers or other programmable circuits within the IC dies shown.

Figure 3:
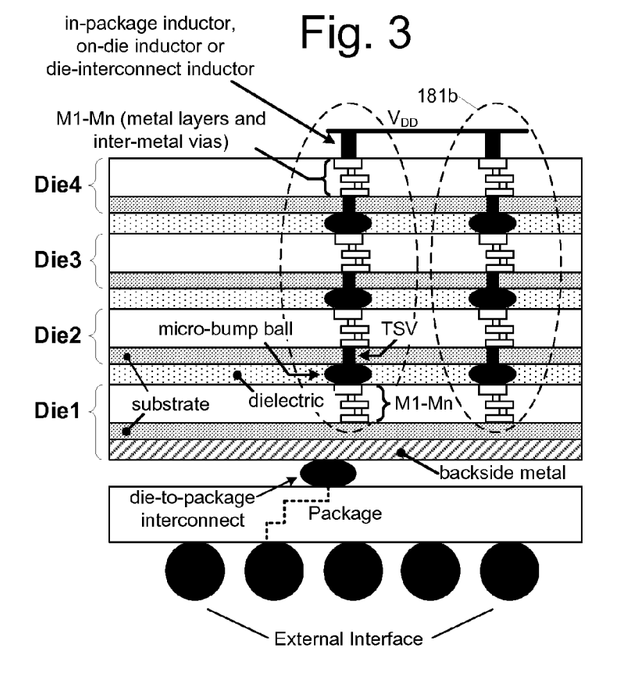
FIG. 3 depicts a cutaway of the multi-die component of FIG. 1 showing exemplary stacks of TSV and micro-bump balls that may be used to form the inductive components of the LC tank circuit described in reference to FIGS. 1 and 2.

FIG. 3 depicts a cutaway of the multi-die component of FIG. 1 showing exemplary stacks of TSV and micro-bump balls that may be used to form the inductive components of the LC tank circuit described above. As shown, each of the IC dies is disposed in an unflipped orientation relative to an external interface of the package, and includes a substrate (e.g., silicon or other semiconductor) having various circuit elements formed therein and interconnected to through one or more metal layers ("M1-Mn") and inter-metal vias. The number of metal layers may vary from die to die (e.g., more metal layers in a controller die than in a DRAM die), and the top metal layer may include a micro-bump pad or other structure that forms an external interface node to be coupled via a micro-bump/TSV unit (or other inductive die-interconnect structure) to another IC die. A backside metal is provided to establish connections (e.g., by way of TSVs, bond wires or other structures) between the on-die circuitry and package-interconnect balls or other interconnects ("die-to-package interconnect") between the die stack and the conductive structures extending to the external interface of the package.

In the embodiment shown, the metal layers and inter-metal vias of each die form a path between the circuit elements formed in the die's substrate and a micro-bump/TSV unit that forms the interconnect to the die above. Accordingly, the micro bump and TSV provided to interconnect each die with the die above may be leveraged as an inductive element of a distributed LC oscillator, thus forming two columns or stacks of micro-bump/TSV pairs corresponding to the two stacks of inductive elements 181a, 181b shown in FIGS. 1 and 2. Thus, the die interconnect structures serve not only as signal interconnects for distributing a clock signal within the multi-die component, but also as inductive elements of the LC oscillator itself. As shown, off-die inductances (e.g., conductive balls or other structures having an inductance roughly equal to a micro bump ball/TSV pair, or having a purposefully selected form factor to establish the net inductance required for the target resonant frequency of the LC tank) are provided to couple the two inductor stacks to a package voltage source (power rail shown, in this example, as $V_{DD}$).

Figure 4:
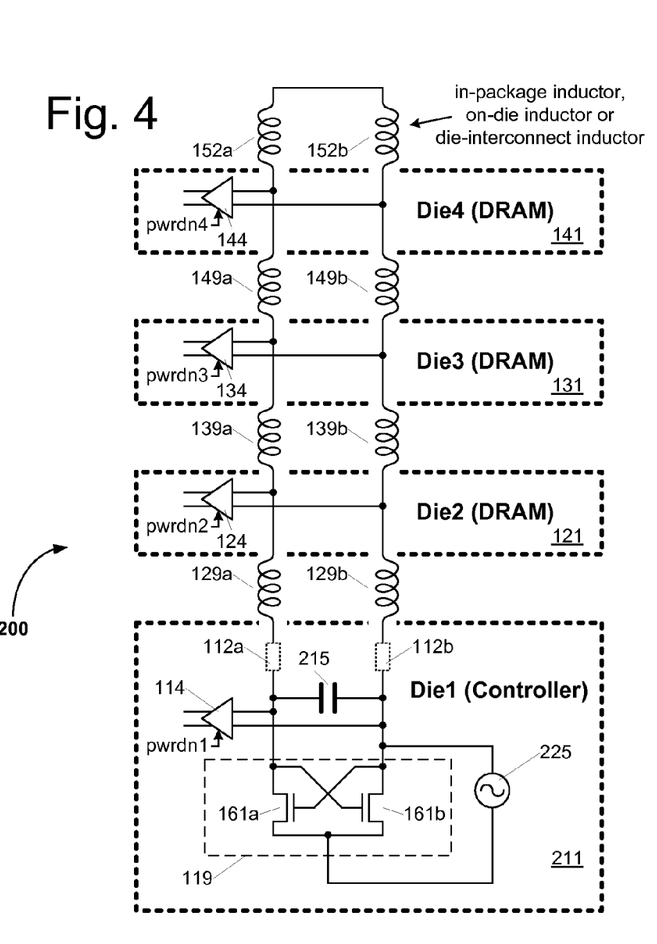
FIG. 4 illustrates an alternative distributed LC oscillator embodiment that relies on injection locking instead of closed loop control.

FIG. 4 illustrates an alternative distributed LC oscillator embodiment that relies on injection locking instead of closed loop control. As in the embodiments above, die-interconnect structures 129a/129b, 139a/139b, 149a/149b are leveraged to form inductive elements within an LC oscillator, but instead of the phase-locked loop control shown in FIGS. 1 and 2, a perturbation oscillator 225 (e.g., a ring oscillator) is coupled as shown (i.e., to the common source nodes of MOS transistors 161a and 161b within gain element 119, and to one node of capacitive element 215) to perturb the LC oscillator. Assuming that the perturbation oscillator has a frequency relatively close to the resonant frequency of the distributed LC oscillator, the LC oscillator will eventually "lock" to the frequency of the perturbation oscillator. The perturbation oscillator 225 may have an internal trim control that allows adjustment (e.g., under register control) within a specified frequency range around the resonant frequency of the distributed LC oscillator, and thus enable the frequency of the LC oscillator to be tuned.

As in the embodiments described in reference to FIGS. 1 and 2, the inductance of the LC oscillator may be adjusted, for example, by enabling on-die inductances to be switchably coupled in series with the die-interconnect inductances and/or by enabling a selectable number of die-interconnect structures to be coupled in parallel (i.e., ganged). Also, though not specifically shown, capacitive element 215 may be subject to digital or analog control, thereby providing another knob for adjusting the resonant frequency of the distributed LC tank.

Figure 5:
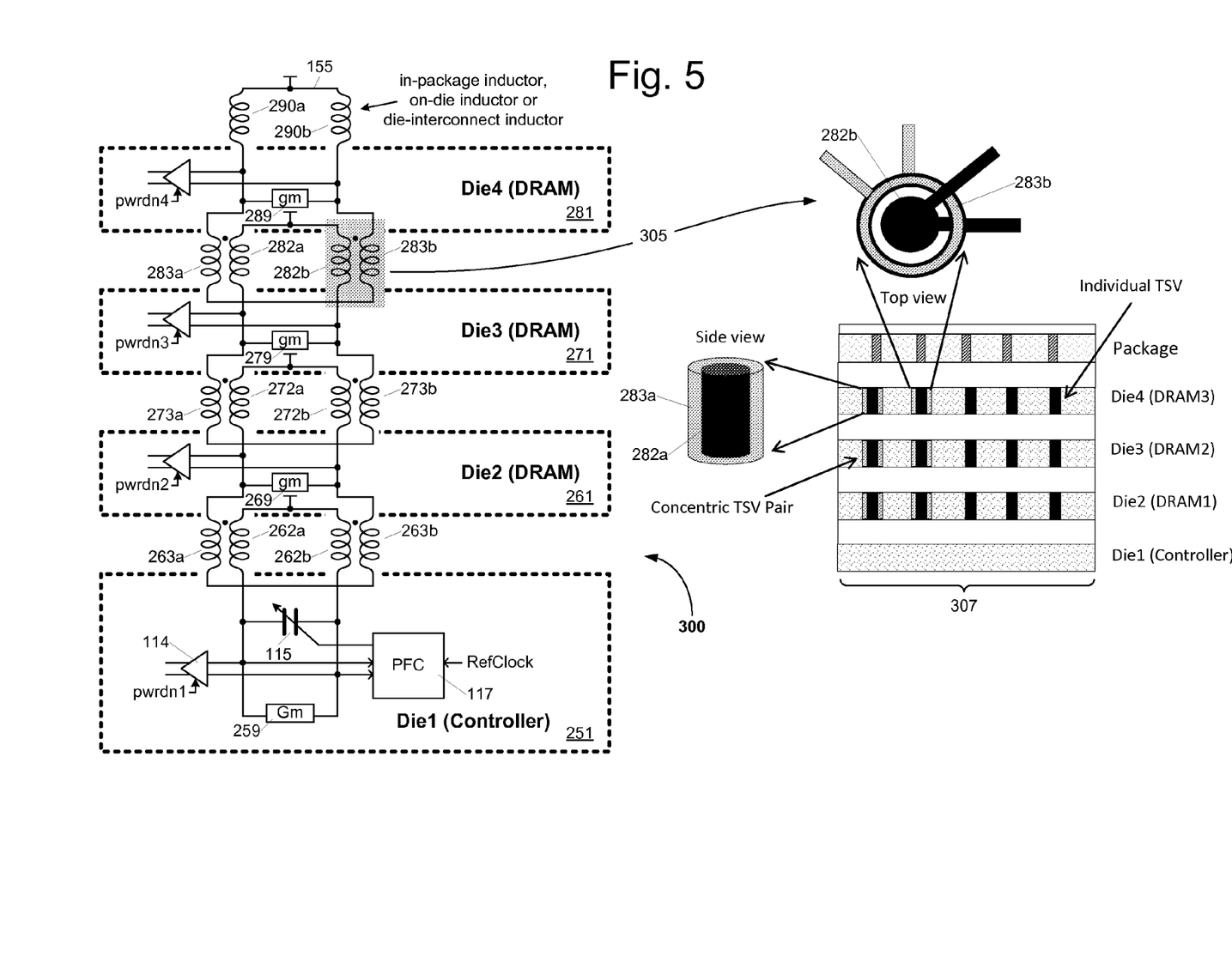
FIG. 5 illustrates an alternative embodiment of a multi-die component in which stages of a distributed LC oscillator are ac coupled to one another

FIG. 5 illustrates an alternative embodiment of a multi-die component (300) in which stages of a distributed LC oscillator are inductively or capacitively coupled (i.e., "ac coupled") to one another. That is, the distributed LC oscillator is constructed generally as described in reference to FIG. 2, except that the clock waveform (i.e., the tank oscillation) is conveyed from die to die via an ac coupling instead of a hardwired, "dc" coupling. More specifically, instead of coupling die interconnects 262a and 262b directly to the clock output nodes within the die 261, the interconnects are coupled in common to a power source within die 261 (thereby enabling the gain circuit 119 in controller die 251 to draw the restorative current needed to maintain the tank oscillation) and respectively accoupled to another pair of die interconnects 263a and 263b. The ac coupling is shown in FIG. 5 as an inductive coupling between two adjacent inductive elements, and thus as a transformer operation (including a dot to denote the in-phase relation between transformer input and output), though the coupling may alternatively be capacitive. Die interconnects 263a and 263b are coupled to one another within controller die 251 and to another gain circuit 269 in the die 261. This arrangement is repeated in IC dies 271 and 281 through die-interconnects 272a/272b, 273a/273b and 282a/282b, 283a/283b and gain circuits 279 and 289, though off-die inductors 290a and 290b are coupled between respective clock output nodes of IC die 281 and power rail 155.

In one embodiment, each ac coupling is formed by a respective concentric TSV pair as shown by the embodiment of die interconnects 282b/283b in detail (top) view 300. That is, each TSV includes an inner via (282b) and an outer via (283b) disposed concentrically and isolated from one another by an oxide or other insulating material. A side-view of this arrangement is shown with respect to concentrically disposed TSVs 282a/283a, together with a package cutaway 307 illustrating the disposition of the concentric TSVs within multi-die component 300 By this arrangement, one of the conductors within the concentric TSV corresponds to one coil within the transformer equivalent, and the other conductor corresponds to the counterpart coil. Each conductor includes top and bottom die connection points, thereby enabling the circuit connections shown.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. An apparatus comprising:
   a plurality of integrated circuit dies, including a capacitive element;
   first interconnect structures extending between respective pairs of the integrated circuit dies and coupled to one another; and
   second interconnect structures extending between the respective pairs of the integrated circuit dies and coupled to one another, wherein the first plurality of interconnect structures and the second plurality of interconnect structures are coupled to one another and to respective nodes of the capacitive element to form an LC (inductor-capacitor) tank circuit.

2. The apparatus of claim 1 further comprising a gain circuit coupled to the first interconnect structures and the second interconnect structures to enable oscillation of the LC tank circuit.

3. The apparatus of claim 2 further comprising a control circuit to adjust the capacitance of the capacitive element to control the oscillation frequency.

4. The apparatus of claim 3 wherein the control circuit comprises a closed-loop circuit that adjusts the capacitance of the capacitive element to reduce a frequency difference between a frequency-divided output of the LC tank circuit and the frequency of a reference clock signal.

5. The apparatus of claim 1 further comprising an oscillator coupled to the LC tank circuit to effect injection-locked oscillation of the LC tank circuit at the oscillation frequency of the oscillator.

6. The apparatus of claim 1 wherein the gain circuit comprises:
a first transistor to conduct current between a first node of the capacitive element and a voltage reference node and having a control terminal coupled to a second node of the capacitive element; and
a second transistor to conduct current between the second node of the capacitive element and the voltage reference node and having a control terminal coupled to the first node of the capacitive element.

7. The apparatus of claim 1 wherein the plurality of integrated circuit dies are stacked to form a three-dimensional integrated circuit device.

8. The apparatus of claim 1 wherein the first plurality of interconnect structures and the second plurality of interconnect structures collectively constitute the predominant inductance of the LC tank circuit.

9. The apparatus of claim 1 wherein the first plurality of interconnect structures comprises a through-silicon via that extends through one of the integrated circuit dies.

10. The apparatus of claim 1 wherein the interconnect structures of the first plurality are connected in series, and the interconnect structures of the second plurality are connected in series.

11. The apparatus of claim 1 wherein the first plurality of interconnect structures comprises a first and second interconnect structures inductively coupled to one another.

12. The apparatus of claim 1 further comprising a plurality of clock distribution circuits formed respectively within the plurality of integrated circuit dies and coupled to receive respective oscillating signals from the LC tank circuit.

13. The apparatus of claim 1 wherein the capacitive element is disposed on a first integrated circuit die of the plurality of integrated circuit dies.

14. The apparatus of claim 1 wherein the plurality of integrated circuit dies comprises a memory controller die and a memory die, the memory die including a storage array that is accessed in response to commands from the memory controller die.

15. An apparatus comprising:
first and second interface nodes to be coupled to counterpart interface nodes of one or more additional integrated circuit dies through inductive die-interconnect structures;
a capacitive element coupled in parallel with the first and second interface nodes to form, together with the inductive die-interconnect structures, an LC tank circuit;
circuitry to enable oscillation of the LC tank circuit; and
a clock distribution circuit to receive a first oscillating signal from the LC tank circuit.

16. The apparatus of claim 15 wherein the circuitry to enable oscillation of the LC tank circuit comprises closed-loop control circuitry which, together with the LC tank circuit comprises a phase-locked loop.

17. The apparatus of claim 16 wherein the phase-locked loop comprises circuitry to adjust the capacitance of the capacitive element to reduce a frequency difference between a frequency-divided instance of the first oscillating signal from the LC tank circuit and the frequency of a reference clock signal.

18. The apparatus of claim 15 wherein the circuitry to enable oscillation of the LC tank circuit comprises an oscillator to effect injection-locked oscillation within the LC tank circuit.

19. The apparatus of claim 15 wherein oscillation of the LC tank circuit produces additional oscillating signals within the one or more additional integrated circuit dies that are substantially phase-aligned with the first oscillating signal.

20. An apparatus comprising:
a capacitive element that forms part of an LC tank circuit in which inductive interconnect structures to be coupled between the apparatus and an integrated circuit die form part of the inductance of the LC tank circuit;
means for receiving a clock signal from the LC tank circuit; and
means for changing the capacitance of the capacitive element to adjust the frequency of the clock signal.

* * * * *